United States Patent
Redpath

(10) Patent No.: US 8,482,924 B2
(45) Date of Patent: Jul. 9, 2013

(54) HEAT SPREADER FACET PLANE APPARATUS

(76) Inventor: Richard Redpath, Cary, NC (US)

(*) Notice: Subject to any disclaimer, the term of this patent is extended or adjusted under 35 U.S.C. 154(b) by 333 days.

(21) Appl. No.: 12/901,668

(22) Filed: Oct. 11, 2010

(65) Prior Publication Data

US 2012/0085525 A1 Apr. 12, 2012

(51) Int. Cl.
*H05K 7/20* (2006.01)

(52) U.S. Cl.
USPC .......... 361/710; 361/675; 361/676; 361/690; 362/259; 362/276; 362/518; 362/547

(58) Field of Classification Search
None
See application file for complete search history.

(56) References Cited

U.S. PATENT DOCUMENTS

| | | | | |
|---|---|---|---|---|
| 7,138,999 B2* | 11/2006 | Alliez et al. | | 345/423 |
| 7,798,684 B2* | 9/2010 | Boissevain | | 362/431 |
| 7,813,111 B2* | 10/2010 | Anderson et al. | | 361/674 |
| 7,974,099 B2* | 7/2011 | Grajcar | | 361/720 |
| 8,081,475 B1* | 12/2011 | Holley | | 361/719 |
| 2005/0145858 A1* | 7/2005 | Loh | | 257/81 |
| 2007/0230186 A1* | 10/2007 | Chien | | 362/294 |
| 2007/0253201 A1* | 11/2007 | Blincoe et al. | | 362/294 |
| 2009/0185350 A1* | 7/2009 | Grajcar | | 361/704 |
| 2011/0037367 A1* | 2/2011 | Wang et al. | | 313/46 |
| 2011/0051449 A1* | 3/2011 | Biebl et al. | | 362/538 |
| 2011/0103011 A1* | 5/2011 | Koplow | | 361/679.54 |
| 2012/0007742 A1* | 1/2012 | Gooch et al. | | 340/584 |

* cited by examiner

*Primary Examiner* — Courtney Smith
(74) *Attorney, Agent, or Firm* — Ming Chow; Sinorica, LLC

(57) ABSTRACT

The invention provides an apparatus for dissipating heat produced by a laser for lighting projection to enable a passive encapsulated enclosure. The laser is mounted into a collar system which integrates to the internal enclosure body with a single or plurality of bonded extending facet planes. The facet planes can conduct and radiate heat to the internal enclosure body planes which dissipate heat to the outside environment of the closed enclosure as a heat sink.

3 Claims, 6 Drawing Sheets

REDPATH20100010

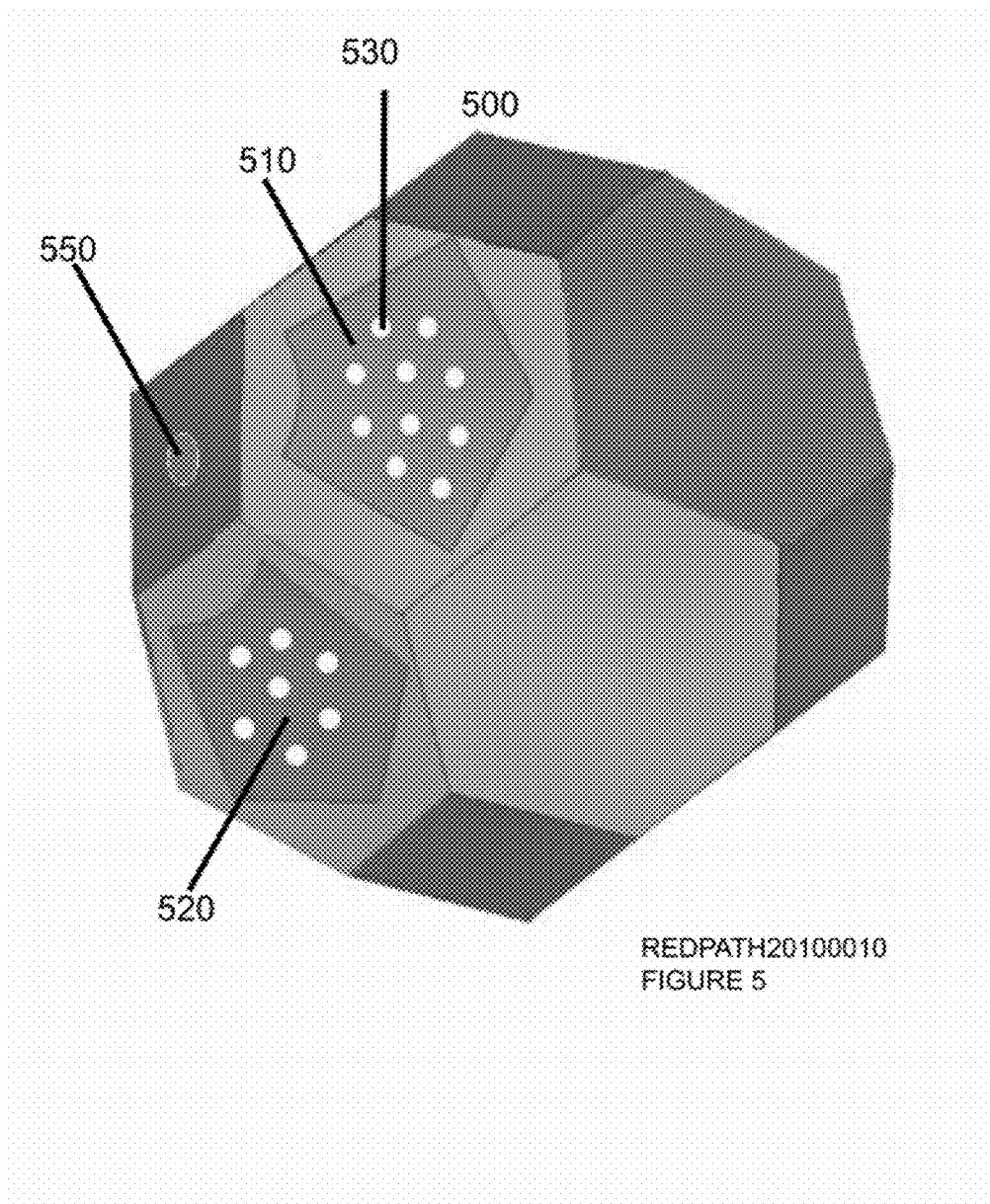

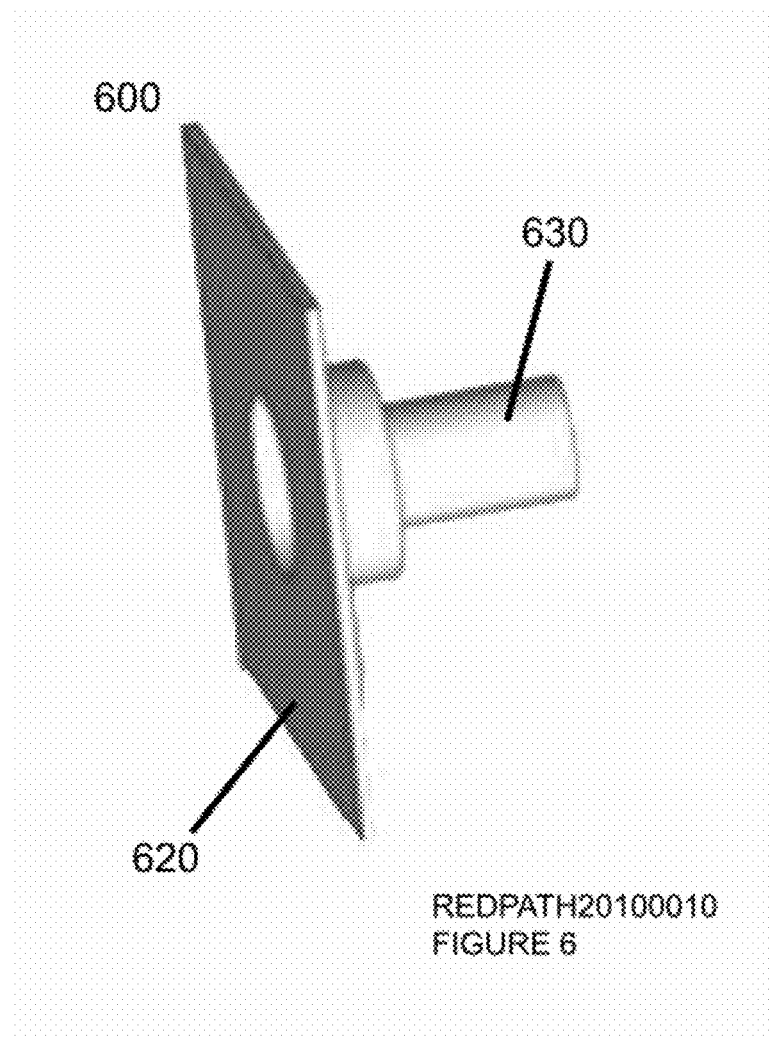

HEAT SPREADER FACET PLANE APPARATUS

BACKGROUND OF INVENTION

This invention relates generally to an apparatus for the removal of heat from an electronic component. Particularly, this invention relates to an apparatus that is used to dissipate heat from a sealed enclosure for a laser diode lighting projection system.

Laser projection systems utilize laminar flow of air to cool the laser system. The enclosures of these systems provide air ports, are not fully closed and most commonly supply a fan system which produces some level of noise, moving parts that can fail as well as incapability for water resistance. Additionally, prior art systems such as handheld that are closed typically use a fin based metal system for laminar flow that is observable to the user of the system. Clearly there is a need for an enclosed passive system to provide no noise, limit the point of failure and enable water resistance for a compelling closed enclosure design for the user.

In this respect, the Heat Spreader Facet Plane Apparatus system substantially departs from the conventional design of the modern day prior art and in doing so provides a noiseless new entertainment system with a unique greater potential.

BRIEF SUMMARY OF INVENTION

The invention relates to an apparatus for heat dissipation for a laser light projection system for use in entertainment, and, in particular, as a night light or party light. In view of the prior art, the present invention provides a unique entertainment system that is in a closed enclosure, noiseless, no moving parts and capable for water resistance with greater potential use.

BRIEF DESCRIPTION OF DRAWINGS

FIG. 5 is a diagram of the closed enclosure which implements small holes to the embodiment bonded to the internal facets.

FIG. 6 is a diagram of the heat spreader facet plane apparatus implemented with a single plane for completeness.

DETAIL DESCRIPTION OF THE INVENTION

Figure 1:
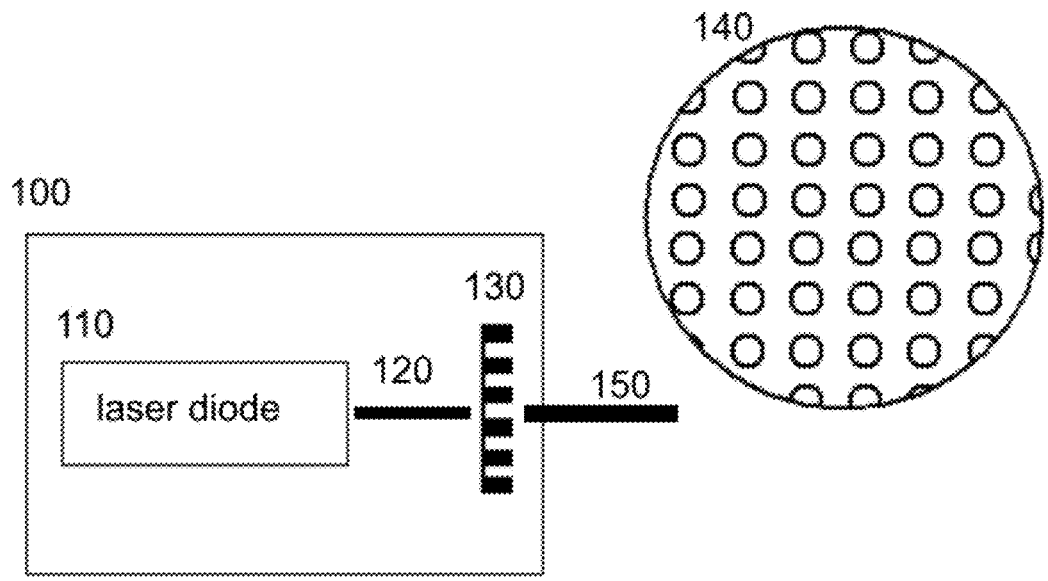
FIG. 1 is a diagram of the laser diffraction construction for the embodiment operation of a laser light projection system.

Referring to FIG. 1 at 100 is the operational laser light projection system which is constructed of a laser diode at 110 producing a beam at 120 to be incident with diffraction grating at 130. At 140 is a cross section of the output beam at 150 from the diffraction grating at 130.

An optimal diffraction grating at 130 for the embodiment to produce the effect of multiple laser beams can be calculated with the formula at 160. The displacement y is equal to the order m times the wavelength Lambda times the distance D divided by the slit separation d. The displacement from the center line for orders of m can be computed for optimal beam displacement. One skilled in the area of diffraction grating products can accurately compute the best diffraction grating but for completeness a 50 lines/mm diffraction grating is recommended. A 50 lines per millimeter diffraction grating has a slit separation of 20 micrometers 2.0E-5 meters. Lamba is a green laser at 542 nm, D is a projection of 300 cm for an application such as a stage. Referring to FIG. 1 at 160 the formula result for a 50 lines/mm diffraction grating for first order m=1 computes a distance separation of approximately 8.13 cm. If the laser is red at 650 nm the displacement is 9.75 cm. For completeness the laser diode module at 110 should have a power output for safety of 5 mw to 10 mw at a wavelength of 532 nm with a divergence less than 1 mrad and beam diameter 1 mm.

Figure 2:
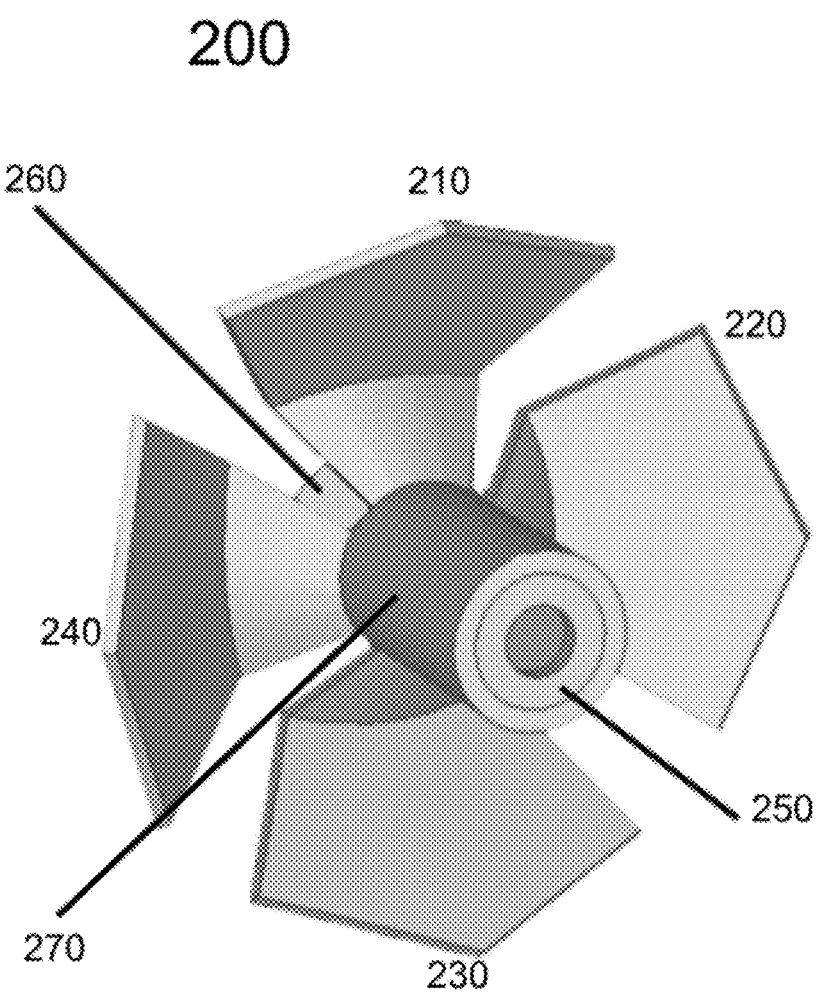
FIG. 2 is a diagram of the heat spreader facet plane apparatus embodiment.

Referring to FIG. 2 at 200 is an implementation of the embodiment. At 250 and 260 is the laser diode which is inserted into the collar assembly at 270. At 210, 220, 230, and 240 are facet planes that extend from the collar assembly at 270 to enable bonding to an assembly enclosure for heat spreading from the collar at 270.

Figure 3:
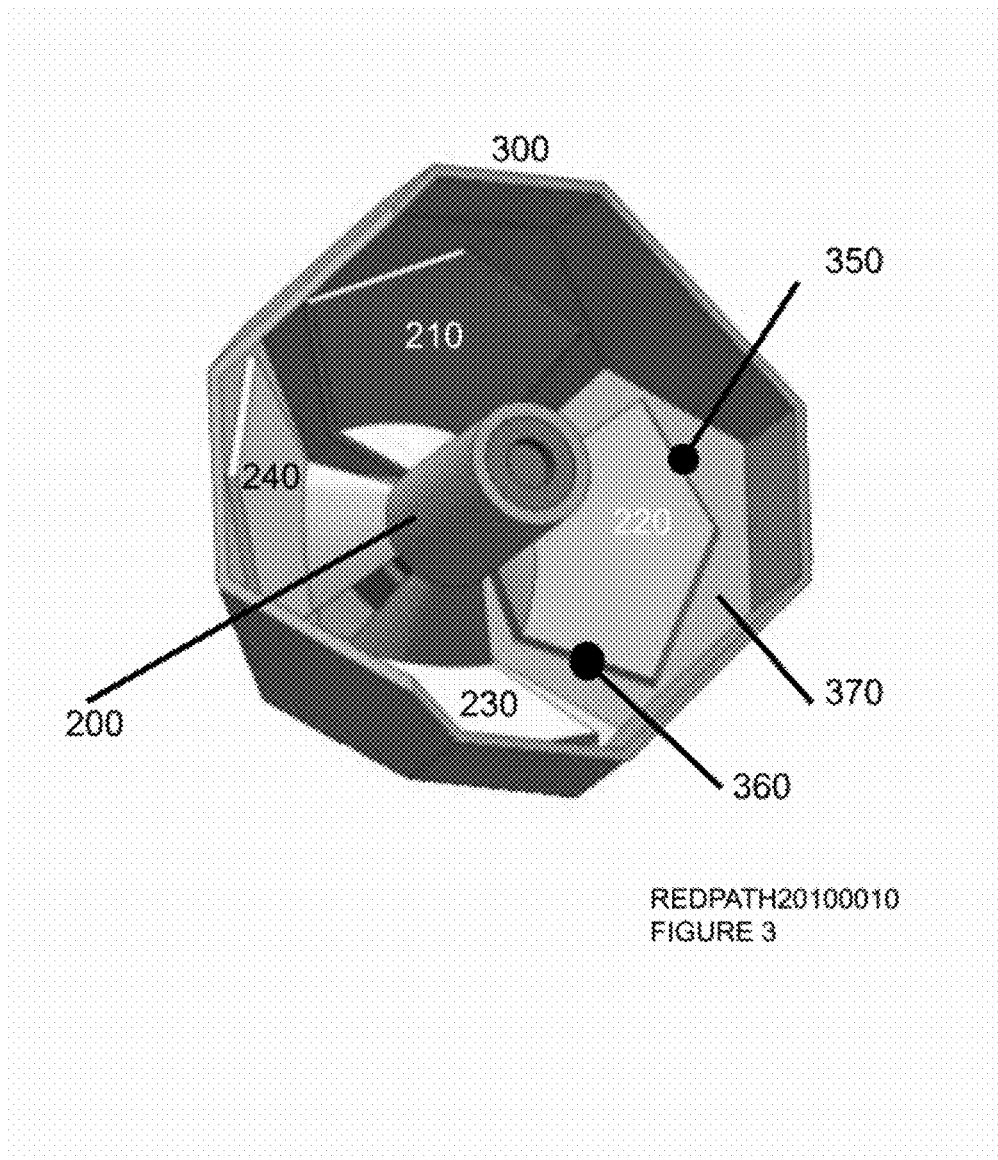
FIG. 3 is a cut away diagram of the embodiment bonded to the enclosure that is normally closed.

Referring to FIG. 3 at 300 is a cut away drawing of an enclosure which has the embodiment implementation in FIG. 2 at 200 inserted. Referring to FIG. 3 the facet planes at 210, 220, 230, and 240 of the embodiment are bonded to the inner surface of the cut away enclosure at 300. One skilled in the area of cooling design would utilize thermo grease to bond the facet planes 210,220,230, and 240 to the enclosure at 300. For clarity at 350 and 360 a dot of glue is used to hold the facet 220 against the interior plane at 370.

Figure 4:
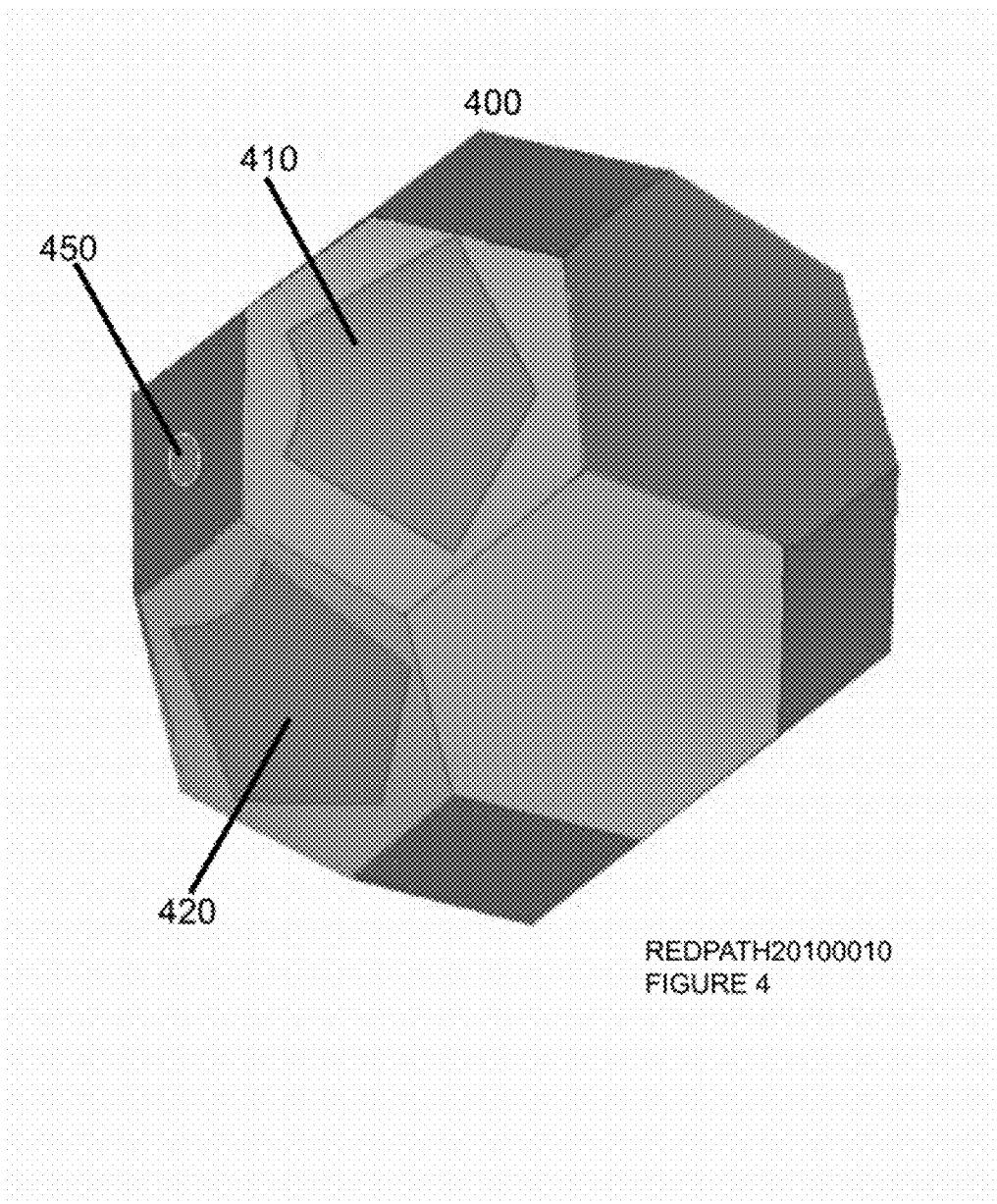
FIG. 4 is a diagram of the closed enclosure which has the embodiment bonded to the internal facets.

Referring to FIG. 4 at 400 is an enclosure which contains the embodiment refer to FIG. 2 at 200. Referring to FIGS. 4 at 410 and 420 are shown an outline where embodiment facet planes are bonded to the inner surface of the enclosure at 400. At 410 and 420 the embodiment facet planes will conduct heat to the enclosure which heat sinks to the outside of the enclosure. At 450 is a glass closed port for the laser output. In this way the enclosure at 400 is completely closed.

Referring to FIG. 5 at 500 is an enclosure which contains the embodiment refer to FIGS. 2 at 200. At 510 and 520 are shown an outline where embodiment facet planes are bonded to the inner surface of the enclosure. At 510 and 520 the embodiment facet planes will conduct heat to the enclosure which heat sinks to the outside of the enclosure. At 530 is shown a plurality of holes on the enclosure 500 that expose the embodiment facet planes which is outlined at 510 to heat sink directly to the outside enclosure air.

Referring to FIG. 6 at 600 is an implementation of the embodiment as a single facet to accommodate a more square enclosure. At 630 is the collar structure to allow the laser diode to be inserted and at 620 is a single facet plane surface that is to be mounted to an internal enclosure plane to conduct heat and enable heat sinking from the outside of the enclosure.

What is claimed is:

1. A heat spreader facet plane apparatus, comprising
   a collar assembly in which a laser light projection system is mounted; and
   a single or plurality of facet planes extended from the collar assembly,
   wherein the single or plurality of facet planes are bonded to an internal surface of a closed enclosure for accommodating the laser light projection system and the heat spreader facet plan apparatus so as to enable heat spreading from the laser light projection system to outside of the closed enclosure via the collar assembly and the single or plurality of facet planes.

2. The heat spreader facet plane apparatus of claim 1, wherein a plurality of holes are set on part of the enclosure corresponding to the bonded facet planes so as to partially expose the bonded facet planes directly to outside environment for more efficient heat dissipation.

3. The heat spreader facet plane apparatus of claim 1, wherein the single or plurality of facet planes are painted so as to enable more heat radiation to the enclosure for greater-heat dissipation.

\* \* \* \* \*